United States Patent

Reimer

[15] 3,670,409

[45] June 20, 1972

[54] PLANAR RECEPTACLE

[72] Inventor: William A. Reimer, Wheaton, Ill.

[73] Assignee: GTE Automatic Electric Laboratories Incorporated, Northlake, Ill.

[22] Filed: Nov. 19, 1970

[21] Appl. No.: 90,951

[52] U.S. Cl. ..........................29/625, 174/68.5, 317/101 C, 339/17 B, 339/95

[51] Int. Cl. ........................................H01r 9/12, H05k 3/00

[58] Field of Search ................................339/17, 18, 95–99, 339/95 A, 257; 174/68.5; 317/101 C, 101 CC; 29/625, 626

[56] References Cited

UNITED STATES PATENTS

| | | | |
|---|---|---|---|
| 2,958,064 | 10/1960 | Swengel | 339/17 E |
| 3,200,020 | 8/1965 | Schroeder | 339/17 B X |
| 3,216,089 | 11/1965 | Dettman | 174/68.5 X |
| 3,024,151 | 3/1962 | Robinson | 174/68.5 X |
| 3,079,577 | 2/1963 | Brownfield | 339/95 A X |
| 3,022,480 | 2/1962 | Tiffany | 339/258 A X |
| 3,275,736 | 9/1966 | Hotine et al. | 174/68.5 X |
| 2,965,812 | 12/1960 | Bedford, Jr. | 339/18 R X |
| 3,038,105 | 6/1962 | Brownfield | 339/17 C |

OTHER PUBLICATIONS

IBM Technical Disclosure Bulletin, Vol. 6, No. 8, January 1964, p. 87, " Circuit Board Connective Scheme," by Roche & Palmateer IBM Technical Disclosure Bulletin, Vol. 3, No. 5, October 1960, pg. 14, " Through–Hole Plating" Radovsky & Ronkese

*Primary Examiner*—Marvin A. Champion
*Assistant Examiner*—Terrell P. Lewis
*Attorney*—K. Mullerheim, B. E. Franz and Robert F. Van Epps

[57] ABSTRACT

A planar receptacle for pluggable mounting of electronic component leads therein which is formed by applying a resilient, electrically conductive material over an apertured base, and forming a pattern of planar cuts in said resilient layer over each aperture in the base such that when an electronic component lead is pressed onto the resilient layer over an aperture, the resilient layer will deform into the aperture to form at least one contact apron capable of supporting said electronic component lead and capable of making electrical contact with said lead.

8 Claims, 11 Drawing Figures

INVENTOR
WILLIAM A. REIMER

BY Cyril A. Krenzer
ATTORNEY

PLANAR RECEPTACLE

BACKGROUND OF THE INVENTION

1. Field Of The Invention

This invention relates to planar receptacles for electronic components, and more particularly to pre-formed printed circuit boards having integrally formed planar receptacles for electronic components.

2. Description Of The Prior Art

The development of multiple lead electronic devices has progressed to the stage where they are now commonly used as modular components in complete assemblies, as is evidenced by the growing use of dual-in-line packages, medium-scale integration (MSI), large scale integration (LSI), and the like in a wide variety of applications, including computer memories.

The corresponding development of electronic circuitry for such devices has likewise progressed to automated design programs in which suitable circuitry and components are computer-selected and then pre-formed as modules which may be plugged together in a wide variety of combinations. While multiple lead electronic devices may be soldered to a printed circuit board, miniature devices themselves are difficult to handle by hand due to their extremely small size. The leads connected to such miniature electronic devices, which may vary in number from one up to many dozen, are small and closely packed, making soldering difficult. In addition, repeated heating of several closely spaced leads may itself cause damage, since the temperatures encountered in soldering operations exceed those which the electronic device or printed circuit board can withstand for any length of time.

These problems are compounded when it becomes necessary to remove one or more such electronic devices from a printed circuit board, such as for servicing. While standard sized diodes, transistors, resistors, capacitors, and the like can be removed from solder connections with a printed circuit board on which they are mounted by unsoldering one or more leads at a time, the removal of multiple lead devices from a printed circuit board to which they are soldered requires simultaneous heating of all leads and removal of the component as soon as possible to prevent heat damage to the component or to the printed circuit board itself. A high degree of skill is required to remove solder terminated multilead devices from printed circuit boards without causing either physical or thermal damage to the device, it leads, or the printed circuit board itself.

For these and other reasons, a pluggable arrangement is highly desirable to simplify the removable mounting of multiple lead devices such as semiconductor components, thick film units, and the like onto printed circuit boards. While many mounted component receptacles providing such arrangements are currently available, most such receptacles are individually formed and must be mechanically positioned in corresponding holes in the printed circuit board to provide a suitable mount for a particular multilead component. The added expense of such individual forming and mounting operations adds greatly to the cost of such receptacles, economically restricting the potential applications thereof. Furthermore, these added manufacturing steps and the incorporation of additional elements also add further potential sources of circuit failure, resulting in an inherently lower reliability when such materials are used.

In an attempt to overcome such disadvantages, the prior art has proposed various methods of directly mounting electronic components on printed circuit boards. Such methods have generally been restricted to receptacles accepting a component lead having a specific configuration. Some such methods rest components on tabs projecting from a circuit board over or near mounting holes, and then form a solder connection to establish a good electrical and physical contact between the component and projecting tab. In addition to requiring soldering, such tabs have been expensive to form. Furthermore, such tabs are comparatively fragile and subject to breakage, since they are formed of inelastic materials and protrude from the boards. The prior art has also suggested the use of various shaped integral mounts for providing good physical and electrical contact between components mounted on a circuit board. However, such mounting holes are limited, due to the critical size and shape thereof, to accepting only a small number of correspondingly designed component leads.

In another attempt to overcome such problems, a circuit wiring grid has been embedded within an insulated panel, and connector means provided for contact with leads of components mounted thereon. In such an arrangement, wiring possibilities are limited to connections between the wire mesh grid members, and the panel board must be cut through to sever the conductor and form the desired electric circuit. While such devices are suitable for mounting large or medium sized components having few leads, they are impractical for utilization with miniature components and multilead devices.

One of the most critical problems confronting users of multilead devices mounted on printed circuit boards has been the difficulty in constructing an inexpensive, reliable circuit board having pluggable contacts for receiving multilead devices. Since added manufacturing steps and the presence of additional units added to the circuit board increases the cost of manufacture and decreases the inherent reliability thereof, it would be highly desirable to have available a technique which would allow the formation of contact receptacles during the formation of the printed circuit board itself, without requiring a large number of additional steps or the use of foreign components. In this connection, those concerned with printed circuit board fabrication and mounting means for multilead devices have long recognized the need for a technique which would provide a suitable receptacle which could be fabricated from materials used in making printed circuit boards. Likewise, the need has been recognized for a technique which would allow the formation of receptacles which could receive leads of different sizes and configurations. Additionally, it is difficult, if not impossible, using known methods and conventional circuit boards, to fabricate a receptacle which is integrally formed with the circuit board and which does not require soldering to form a good electrical and physical contact when a lead is inserted therethrough. The present invention fills such needs.

SUMMARY OF THE INVENTION

It is a principal object of the present invention to provide a process for forming resilient planar receptacles.

An object of this invention is to provide integrally formed resilient planar receptacles on a printed circuit board.

A further object of this invention is to provide planar receptacles which will form both spring and electrical contacts when component leads are inserted therethrough.

An additional object of the present invention is to provide a pluggable printed circuit board having receptacles which will accept a wide variety of shaped connectors.

Still another object of the present invention is to provide a process for integrally forming planar contact receptacles on a printed circuit board.

A still further object of the present invention is to provide a process for fo-ming a number of planar receptacles in a single operation during printed circuit board fabrication.

A more specific object of the present invention is to provide printed circuit boards having both planar receptacles and wiring patterns formed from the same material.

A more particular object of the present invention is to provide printed circuit boards having planar receptacles electrically connected to a single wiring side thereof.

Another specific object of the present invention is to provide printed circuit boards having plated through planar receptacles which form double contacts to interconnect a component lead mounted thereon.

Briefly, these and other objects are attained in one aspect of the present invention which provides unique resilient planar receptacles which are formed on printed circuit boards and a process for the manufacture thereof. Receptacle apertures are formed in a supporting base material, suitably sized and shaped for receiving electronic component leads therethrough. A layer of resilient, electrically conductive material is then formed over the supporting base material covering the receptacle apertures therein. A pattern of planar cuts are formed in the resilient, electrically conductive layer over the receptacle apertures, such that when an electronic component lead is pressed onto the resilient layer over the receptacle aperture, the resilient layer will deform into the receptacle aperture to form at least one contact apron capable of supporting the electronic component and making electrical contact with the lead thereof. Conventional printed circuit fabrication techniques permit the formation of any desired number of suitably designed planar receptacles in a single printing and etching operation, forming pluggable component mounting means which will accept any common component cross section shape mounted directly on the base material.

BRIEF DESCRIPTION OF THE DRAWINGS

These and other objects, features, and advantages of the invention will become more fully apparent to those skilled in the art from the following description of an illustrative embodiment of the invention, as shown in the annexed Drawings, wherein like reference characters designate like or corresponding parts throughout the several Figures, and in which.

DESCRIPTION OF PREFERRED EMBODIMENTS

Figures 1, 2, 3:
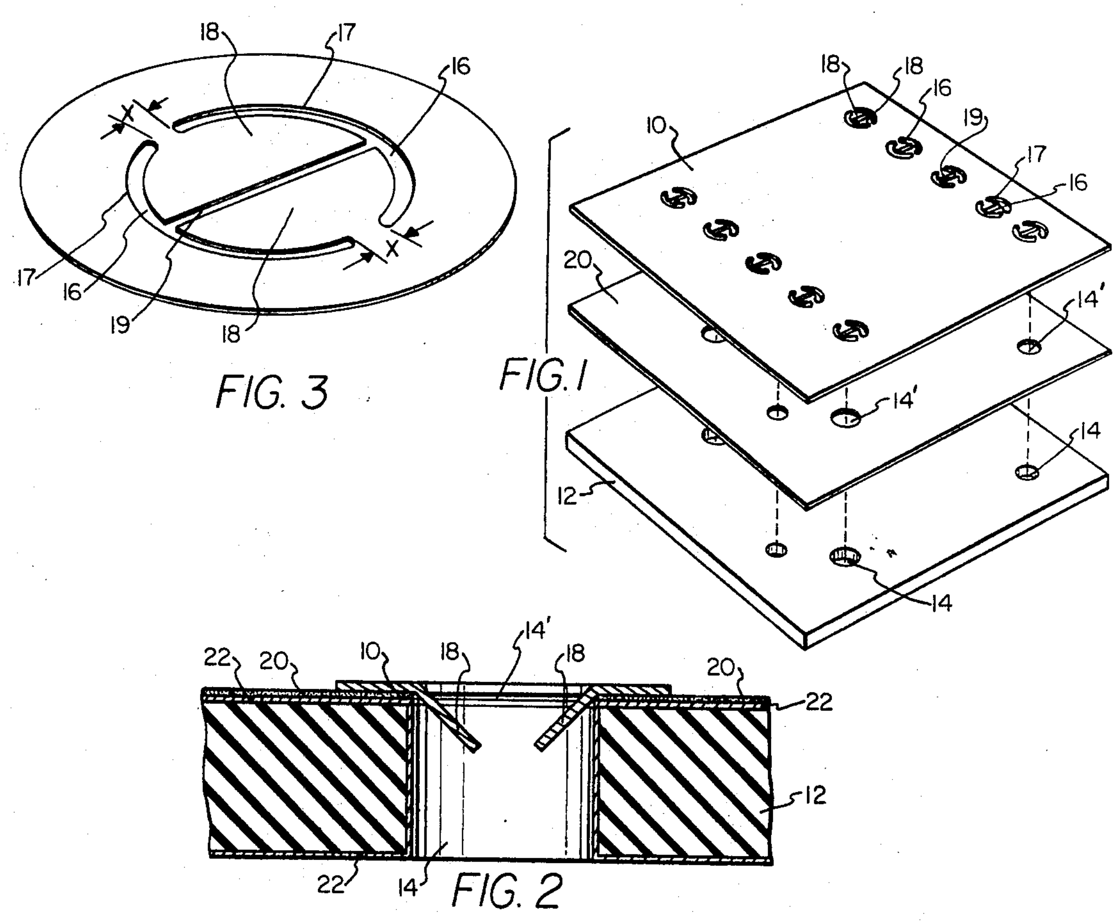
FIG. 1 is an exploded perspective view of a pre-perforated base and dry adhesive layer for a printed circuit board together with a layer of a resilient electrically conductive material having suitable patterns cut therein, which form contact aprons for supplying electronic component leads.
FIG. 2 is a cross-sectional view of a receptacle of the present invention which has a double contact formed to connect an inserted component lead (not shown) to a plated-through hole in the printed circuit board.
FIG. 3 is an enlarged perspective view of one suitable receptacle configuration in accordance with the present invention.

According to the present invention, planar receptacles for pluggable mounting of electronic component leads, as shown in FIG. 1, are prepared by forming a layer of resilient, electrically conductive material 10 over a supporting base 12. The base 12 is provided with at least one receptacle aperture 14, which is suitable for receiving an electronic component lead. Patterns of planar cuts 1 are formed in the electrically conductive resilient layer 10 over each of the receptacle apertures 14 such that when the lead from an electronic component is pressed onto the resilient layer 10, over a receptacle aperture 14, the resilient layer 10 will deform into the receptacle aperture 14 to form at least one contact apron 18, as shown in FIG. 2. The contact aprons 18 act together or with the walls of aperture 14 to support the lead and to make electrical contact with the remainder of the circuit board.

The base 12 may be selected from a wide variety of conventional materials such as are commonly used for preparing printed circuit boards, such as epoxy resins, fiberglas, phenolic resins, ceramic sheets, insulated metal plates and the like. The apertures 14 are formed by drilling, punching, or etching the base 12 at selected areas. Although the receptacle apertures are shown as having circular cross sections, apertures having elliptical, square or cruciform cross-sectional configurations can also be used depending upon the shape and size of the lead which will ultimately be inserted into the receptacle. Of course, the pattern of planar cuts in the electrically conductive material 10 will vary considerably, depending upon the particular cross-sectional configuration of the individual aperture. Where the circuit board is intended to receive a variety of different electrical components or modules, a variety of differently shaped apertures may be formed in a single circuit board. While it is usually most convenient to form the apertures so that they extend completely through the base 12, it is only necessary that the apertures be sufficiently deep that the contact aprons 18 will support the lead and its attached component or module. The layer of resilient electrically conductive material 10 is formed over the base 12 so as to cover apertures 14. One good technique for forming this layer is to laminate a conductive sheet to the base using a suitable adhesive. Although a wide variety of other conventional techniques can equally be used, such as coating, massive vapor deposition, or the like, where the layer is laminated to the base, it is convenient to use a dry adhesive layer 20, as shown in FIG. 1. In this instance, the adhesive layer is perforated to form a series of apertures 14' which will match the receptacle aperture 14 in size, shape, and position. The adhesive layer 20 is then applied to the base so that the apertures in the adhesive layer are in adjacent proximity to the apertures in the base. A sheet of electrically conductive, resilient material is then applied to the adhesive layer, using heat and pressure, if necessary.

The conductive layer 10 can be selected from a wide variety of electrically conductive materials. For example, suitable layers can be formed from alloys of beryllium-copper, phosphor-bronze, or the like. Where desired, the conductive layer 10 itself may be a laminate of several materials in which only the upper surface is conductive. For instance, the upper surface of a resilient non-conductive material may be coated with a layer of a precious metal to provide electrical contact between the lead and the outer circuits.

The thickness of the conductive layer and its temper may be adjusted over wide ranges in order to obtain optimum resilient characteristics for a particular application, depending upon the particular size and weight of the lead and the attached component to be inserted into the receptacle. Obviously, the heavier the lead or the heavier the electronic component, the greater will be the resiliency requirement for sufficient support.

Although FIG. 1 shows a continuous sheet of conductive material 10 being applied to the base 12, in an alternative embodiment, a series of discontinuous sheets can be used;for instance, a separate sheet can be used to correspond to each individual receptacle aperture 14 as shown in FIG. 3.

The conductive layer is then cut in a selected pattern of planar cuts 16 over each of the apertures 14, so that when an electronic component lead is pressed onto the resilient layer at 16 over receptacle aperture 14, the resilient layer will deform into the receptacle aperture 14 to form at least one contact apron 18.

The pattern of cuts will depend upon the particular configuration of the receptacle apertures and the particular shape of the lead intended to be supported. Where the receptacle aperture 14 has a circular cross section, one suitable pattern which forms two contact aprons 18, is shown in FIG. 3. In this instance, the planar cuts are formed in the shape of two opposed and substantially equal size arcs 17 formed along a circular line around the center of the cross section of the receptacle aperture 14. Each of the arc cuts 17 have circular extensions of less than 180° such that their respective ends are separated a predetermined arcuate distance $x$ by integral band portions of resilient contact material. A linear cut 19 bisects the arcuate cuts 17 so as to form the resilient contact aprons 18 between the linear cut 19 and the arcuate cut 17.

This pattern can be modified in a variety of ways to accommodate various shaped leads, or for specialty purposes. For instance, either the width of the bisecting cut 19 or the width of the arcuate cut 17 may be varied. If desired, small holes (not shown) may be provided in the center of the bisecting cut 19 so as to simplify the insertion of the electronic component leads through the pattern of planar cuts 16.

The cuts are referred to herein as "planar" cuts to signify the fact that they are formed in the plane of the conductive layer so that the contact aprons 18 will remain planar until a lead is inserted into the receptacle aperture 14.

The cuts can be formed in the conductive layer by a wide variety of techniques, such as etching, laser cutting, mulling or punching. Since most circuit board fabrication techniques involve an etching step, however, this procedure is usually the most convenient for forming the desired cuts. In order to etch the conductive layer, a mask is applied to the layer so as to leave exposed only those areas intended to be removed. Suitable masks can be formed by conventional silk screening or photoresist techniques, and the etching solution is applied to the surface of the unprotected layer. Etching is usually continued until the cuts pass completely through the conductive layer. However, if desired, etching can be discontinued before complete penetration of the conductive layer occurs. This forms a fractionable pattern whereby the contact aprons 18 can be "punched-out" of the conductive sheet.

When the receptacles of this invention are used in printed circuit board applications, it is usually convenient to etch the circuit patterns concurrrently with the formation of the planar receptacle cuts, so that the same contact material is used for forming the circuits as for forming the contact aprons 18.

In one embodiment of this invention, as shown in FIG. 2, the receptacles are formed in a double-sided or multi-layered printed circuit board having circuit patterns 22 on both sides of base 12. The receptacle apertures 14 are plated with a precious metal, such as gold or platinum, so that a double contact is formed which interconnects the electrical component lead (not shown) to the printed circuit patterns 22 through the receptacle 14. An adhesive layer 20 is then applied over one of the circuit patterns and the resilient, electrically conductive layer 10 is laminated to the structure and treated as described above.

Figure 4:
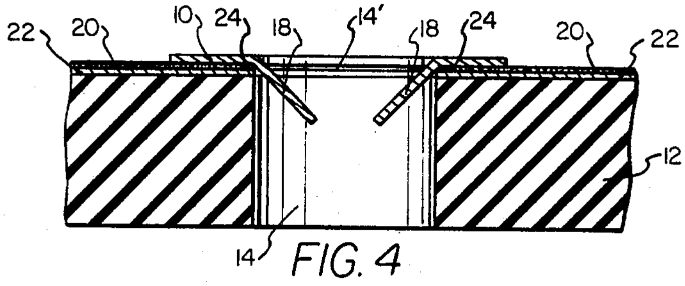
FIG. 4 is a cross-sectional view of a receptacle of the present invention which is electrically connected to the wiring of a single-sided printed circuit board.

In another embodiment of this invention, as shown in FIG. 4, the receptacle 14 is formed over the wiring side of a single sided printed circuit board. In this embodiment, the circuit pattern 22 is formed on base 12. A reflow solder connection 24 is applied to the circuit pattern and adhesive 20 and resilient, electrically conductive layer 10 are laminated over the circuit pattern and treated as described above to form the desired planar receptacle. Electrical contact between the circuit pattern 22 and the resilient, electrically conductive layer 10, is made through solder layer 24.

Figure 5:
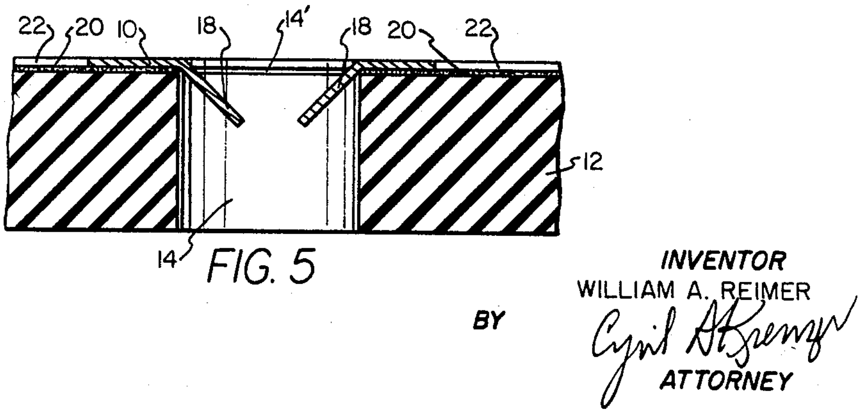
FIG. 5 is a cross-sectional view of another receptacle of the present invention in which the wiring patterns are formed from the same material.

In still another embodiment of this invention, as shown in FIG. 5, the printed circuit patterns 22 and the resilient, electrically conductive layer 10 are formed from the same material. In this instance, it is usually most convenient to form the patterns of planar cuts 16 and the wiring circuits 22 in a single etching procedure, although sequential etching may also be satisfactory.

Figure 6A:
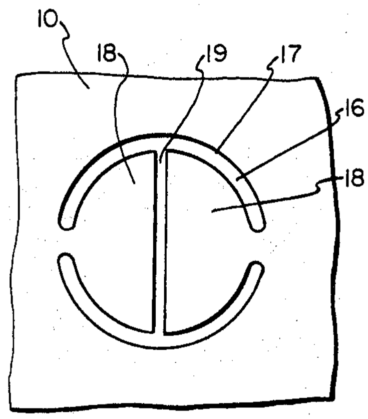
FIGS. 6*a*, 7*a*, and 8*a* are top views showing a component lead being inserted through a receptacle of the present invention.
Figure 7A:
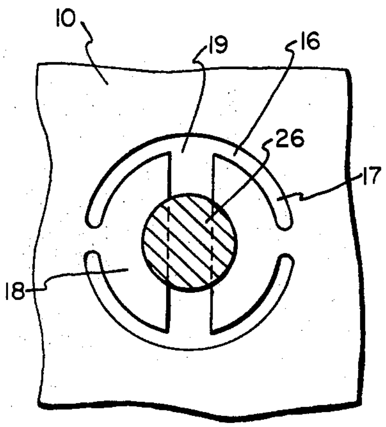
Figure 6B:
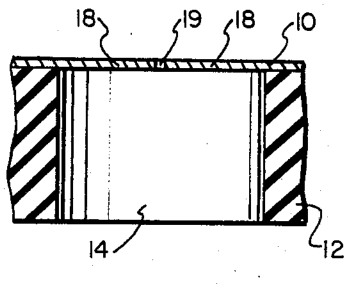
FIGS. 6*b*, 7*b*, and 8*b* are partial cross-sectional views corresponding to FIGS. 6*a*, 7*a*, and 8*a*.
Figure 7B:
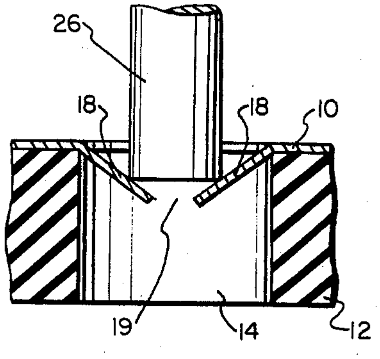

Referring now to the operation of the receptacles as shown in FIGS. 6*a* and 6*b* to FIGS. 8*a* and 8*b*, as shown in FIGS. 6*a* and 6*b*, the contact aprons 18, formed between the arcuate cuts 17 and the linear cut 19 in the resilient, electrically conductive layer 10, are situated over receptacle aperture 14. These aprons 18 will be in approximately the plane of the printed circuit board material 10 until a lead is inserted therethrough; hence, the name "planar receptacles." When the lead 26 is pressed against the pattern of planar cuts 16 in the electrically conductive layer 10, the aprons 18 will begin to deform into the receptacle aperture 14, as shown in FIGS. 7*a* and 7*b*. Because of the resiliency of the electrically conductive material 10, the contact apron 18 will exert a resilient force against the lead 26 which will resist the movement of lead 26. If lead 26 were again withdrawn, the contact aprons 18 would immediately return to their original planar positions.

Figure 8A:
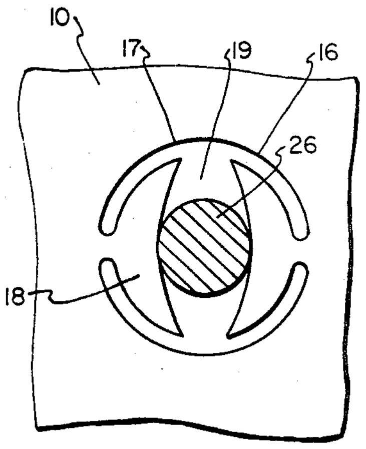
Figure 8B:
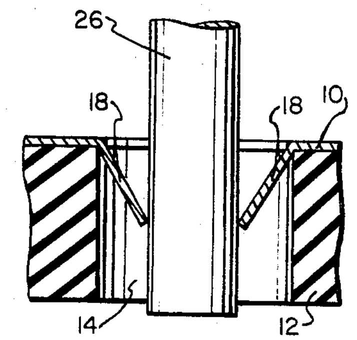

As the downward force of the lead 26 continues, the contact aprons 18 will separate sufficiently so that the lead 26 will penetrate through the opening 19 formed between the contact aprons 18, as shown in FIGS. 8*a* and 8*b*. Once the lead 26 passes through opening 19, the resilient forces on the contact aprons 18 will cause the aprons to exert an upward force on the sides of the lead in a pincer-like fashion, so as to support the lead and make good electrical contact therewith.

The receptacles of the present invention provide a number of distinct advantages for pluggable mounting of electronic components, as compared with conventional pluggable mounted boards. For instance, since adequate support and electrical contact can be obtained for most applications, electronic components may be pluggably mounted onto the supporting base without the use of expensive, or time-consuming soldering techniques. Electronic components can now be rapidly mounted onto the circuit board in a single movement procedure without the necessity of added tools or equipment. Moreover, the electronic components can subsequently be rapidly disassembled without damage to the surrounding circuit board.

Having now fully described the invention, it will be apparent to one of ordinary skill in the art that many changes and modifications can be made thereto without departing from the spirit or scope of the invention. Accordingly, it is intended that the invention not be limited to the specifics of the foregoing embodiments and implementations, but rather is to embrace the full scope of the appended claims.

What is claimed and intended to be secured by letters patent of the United States is:

1. A process for forming planar receptacles for pluggable mounting of electronic component leads, which comprises the steps of:

a. forming at least one receptacle aperture in a supporting base which is suitable for receiving an electronic component lead;

b. forming a layer of resilient, electrically conductive material over said supporting base material and covering said receptacle aperture; and c. forming a pattern of planar cuts in said resilient layer over said receptacle aperture such that when an electronic component lead is pressed onto said resilient layer over a receptacle aperture, said resilient layer will deform into said receptacle aperture to form at least one contact apron capable of supporting said electronic component lead and capable of making electrical contact with said lead.

2. The process of claim 1, wherein a dry adhesive layer is laminated onto said base and wherein said resilient layer is laminated to said base by means of said dry adhesive layer.

3. The process of claim 2, in which said patterns of planar cuts are formed using photoresist techniques.

4. The process of claim 3, in which said patterns of planar cuts are formed by the use of a chemical etchant.

5. The process of claim 3, in which a printed circuit pattern is formed concurrently with the formation of said patterns of planar cuts.

6. The process of claim 4, in which said supporting base material is a printed circuit board.

7. The process of claim 3, in which at least one of said patterns of planar cuts is in the shape of at least two opposed substantially equal sized arc cuts formed along a circular line around the center of said receptacle, the arc cuts each being of an angular extension less than 180° such that the respective ends thereat are separated a predetermined arcuate distance by integral band portions of said resilient contact material, with a linear cut bisecting said arc cuts, forming resilient contact aprons between said linear cut and said arc cuts.

8. The process of claim 3, wherein the walls of said receptacle apertures with said base are coated with a precious metal.

* * * * *

UNITED STATES PATENT OFFICE

CERTIFICATE OF CORRECTION

Patent No. 3,670,409 Dated June 20, 1972

Inventor(s) WILLIAM A. REIMER

It is certified that error appears in the above-identified patent and that said Letters Patent are hereby corrected as shown below:

Change title to -- PROCESS FOR FORMING PRINTED CIRCUIT BOARDS HAVING INTEGRAL PLANAR RECEPTACLES FOR ELECTRONIC COMPONENTS Signed and sealed this 26th day of December 1972.

(SEAL)
Attest:

EDWARD M.FLETCHER,JR.
Attesting Officer

ROBERT GOTTSCHALK
Commissioner of Patents